United States Patent [19]

Frister

[11] 4,219,798
[45] Aug. 26, 1980

[54] AUTOMOTIVE ON-BOARD NETWORK ELECTRICAL SYSTEM WITH WARNING MEANS TO INDICATE TROUBLE IN THE ALTERNATOR OF THE SYSTEM

[75] Inventor: Manfred Frister, Schwieberdingen, Fed. Rep. of Germany

[73] Assignee: Robert Bosch GmbH, Stuttgart, Fed. Rep. of Germany

[21] Appl. No.: 897,036

[22] Filed: Apr. 17, 1978

[30] Foreign Application Priority Data

Apr. 27, 1977 [DE] Fed. Rep. of Germany ....... 2718658

[51] Int. Cl.² .............................................. G08B 19/00
[52] U.S. Cl. .................................. 340/52 F; 340/595; 340/682; 340/57
[58] Field of Search ............... 340/57, 682, 595, 52 F, 340/52 D

[56] References Cited

U.S. PATENT DOCUMENTS

| | | | |
|---|---|---|---|
| 3,214,730 | 10/1965 | Prewitt | 340/52 D |
| 3,728,702 | 4/1973 | Miyamoto et al. | 340/595 |
| 3,772,642 | 11/1973 | Schlorke | 340/52 F |
| 3,824,579 | 7/1974 | Waseleski, Jr. et al. | 340/682 |

*Primary Examiner*—Glen R. Swann, III
*Attorney, Agent, or Firm*—Frishauf, Holtz, Goodman & Woodward

[57] ABSTRACT

A heat sensor, typically a cold-conductor resistor with a high temperature coefficient, is located close to a bearing of the alternator. It is connected to an evaluation network which, in turn, is connected to the charge control indicator to cause the charge control indicator to provide a trouble indication if the temperature of the bearing rises above a predetermined limit.

5 Claims, 1 Drawing Figure

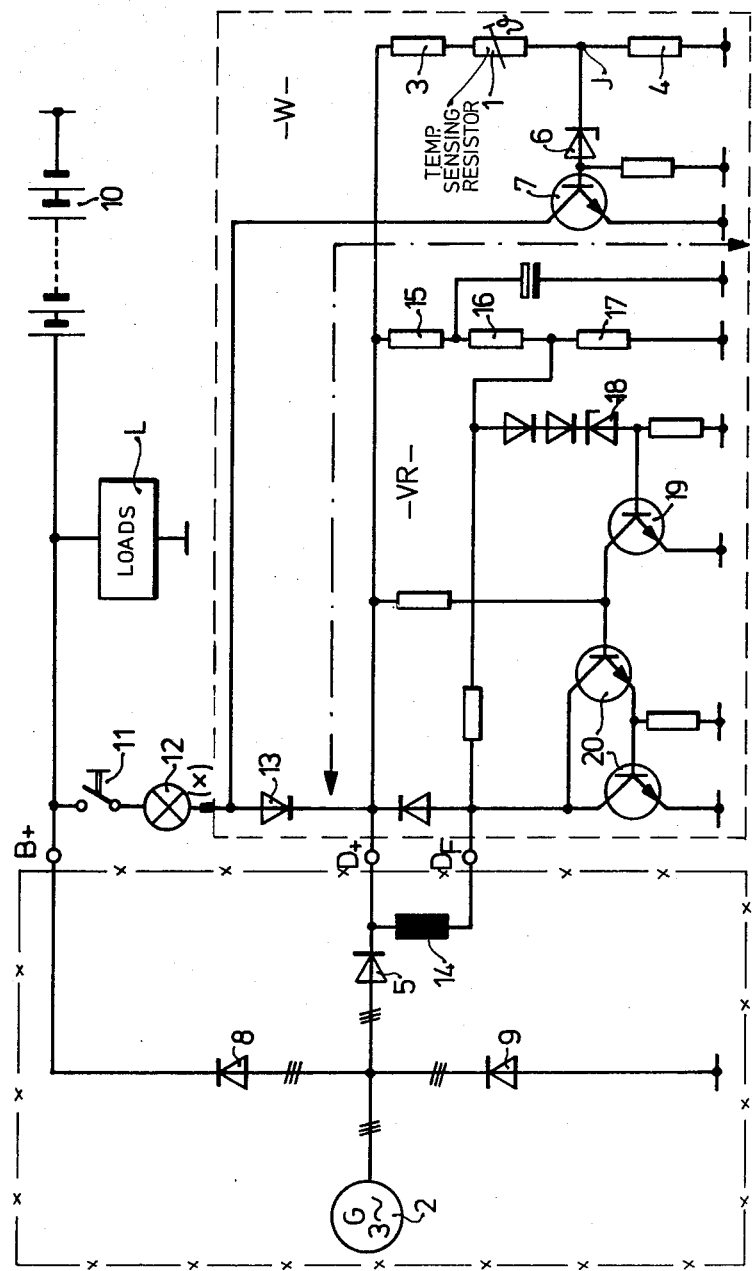

AUTOMOTIVE ON-BOARD NETWORK ELECTRICAL SYSTEM WITH WARNING MEANS TO INDICATE TROUBLE IN THE ALTERNATOR OF THE SYSTEM

GENERAL DESCRIPTION

The present invention relates to a device to recognize bearing defects in dynamo electric machines, and more particularly to recognize bearing defects in alternators supplying electrical power to the on-board network of automotive vehicles.

BACKGROUND AND PRIOR ART

Various types of warning devices have been proposed to indicate whether bearings in dynamo electric machines are worn. The accuracy of operation of bearings in automotive alternators is particularly important due to the relatively small air gap with which these machines operate. In previously proposed warning devices the wobble effect was utilized that is, bearings have increased play therein shortly before failure. Warning devices therefore have been utilized in which the bearing play can be sensed and, if the bearing play increases above a predetermined value, an indication of incipient malfunction is provided. Such warning devices are difficult to install, particularly in the compact structures of automotive alternators in which bearing play which leads to damage is very small, so that recognition of damage likewise requires sensing extremely small deviations from a predetermined tolerance level.

THE INVENTION

It is an object to provide a system and arrangement to recognize defects in bearings, and more particularly to provide an indication of bearing failure of claw-pole automotive alternators, which is simple and easily incorporated in existing automotive-type network systems.

Briefly, a temperature sensor is located in thermal transfer relation, that is, adjacent at least one of the bearings of the dynamo electric machine; if the bearing temperature rises above a predetermined level, a warning signal is provided which triggers a warning indicator.

In accordance with a feature of the invention, the resistor which, typically, is a cold conductor resistor with a large temperature coefficient, is located in heat transfer relation with at least one of the bearings of the alternator of an automotive electrical system, and connected to an evaluation network which, in turn, is connected to the charge control indicator of the automotive charging system to cause the indicator to provide a trouble indication if the temperature of the bearing, and hence the resistance of the temperature sensitive resistor changes beyond a predetermined limit.

Temperature sensitive resistors are small and simple, and thus can readily be incorporated in automotive alternators, in spite of their compact construction. It is not difficult to place such resistors adjacent at least one of the bearings. The system is reliable and can utilize the already existing warning lamp which is present in most automotive on-board networks. The charge control lamp which normally is extinguished when the engine is running normally would light up if there is excessive drain on the battery, or in case of trouble. Upon normal operation of the engine, illumination of the charge control lamp thus will be a trouble indication.

The system can readily be adapted to be incorporated in the circuit of a transistorized voltage regulator customary in automotive on-board electrical networks to control the voltage of the alternator, so that the voltage regulator together with the bearing trouble indicator can form a single unit, requiring only one plug connection.

The drawing illustrates a preferred example, wherein the single FIGURE is a schematic diagram of the system.

DESCRIPTION OF PREFERRED EMBODIMENT

The invention will be described in connection with an automotive on-board vehicular electrical system.

An alternator 2 which, typically, is a three-phase slip ring-less alternator, is connected through two banks of rectifiers 8, 9 to a B+ terminal which, in turn, is connected to the positive terminal of a battery 10. Loads L are connected to the positive bus, as is customary. An additional bank of rectifiers 5 is provided to furnish direct current output from the alternator to supply the field 14 thereof. The alternator and the rectifier networks are shown only schematically, the three cross lines schematically indicating that the rectifier banks are three-phase rectifiers. The alternator is connected to a voltage regulator VR and, in accordance with the invention, to an additional warning network W which includes as its major sensing element a temperature sensing resistor 1. Temperature sensing resistor 1 is located in the vicinity of one of the bearings of the three-phase alternator 2. The temperature sensor 1 may, for example, be a cold conductor which has a high temperature coefficient of resistance, that is, which changes from a low resistance to a high resistance value when the temperature, to which the resistor 1 is exposed, rises. Several such resistors can be connected in series, for example two such resistors, one each in heat conductive relation to a bearing of the generator 2.

The temperature sensor 1 is part of a voltage divider formed as the series circuit of a resistor 3 and a resistor 4. Resistor 4 is connected to the negative terminal of the system, for example ground or chassis of the automotive vehicle. The resistor 3 is connected with the terminal D+, a customary output terminal of the vehicular network (see the drawing). The terminal D+ has rectified exciter voltage appear theron supplying exciter power to the field 14. The junction J between the cold conductor 1 and the resistor 4 is connected through a Zener diode 6 to the base of the switching transistor 7.

The power rectifiers 8, 9, connected to the output of alternator 2, supply the load current. An ignition switch 11 is serially connected to a charge control lamp 12. The charge control lamp 12 is additionally connected through a diode 13 to the terminal D+. The junction between the charge control lamp and the diode 13 is connected to the collector of the switching transistor 7. If transistor 7 is controlled to become conductive, a closed circuit will be established through charge control lamp 12 if ignition switch 11 is closed.

The voltage regulator VR can be constructed in various well-known ways and operates as well known; in the illustration as shown, the voltage which appears at terminal D+ is also applied to a voltage divider formed by resistors 15, 16, 17. The junction between resistors 16, 17 is connected through a group of diodes and a Zener diode 18 to an amplifier 19, 20, which amplifier 20 is a Darlington unit which, when conductive, connects the DF terminal of the alternator, that is, the other terminal of field 14.

General system operation

Let it be assumed that ignition switch 11 is closed and the engine of an automotive vehicle started, so that the alternator 3 will begin to rotate, at low speed. Upon low-speed operation, the voltage at terminal D+ is relatively low and thus the voltage at the junction of resistors 16, 17 will be low. This low voltage causes Zener diode 18 to block, thus blocking the preamplifying transistor 19 so that the base of the Darlington transistor pair 20 will have essentially full operating voltage of the value appearing at terminal D+ appear thereat. The Darlington transistor 20 thus is conductive and full current can flow through field coil 14 of the generator 2. With the field current ON, the voltage at terminal D+ rises and consequently the voltage at the junction between resistors 16, 17 will rise. When this voltage exceeds the breakdown threshold level of the Zener diode 18, transistor 19 becomes conductive and Darlington transistor 20 will block. This disconnects the circuit through the field 14. If the voltage of the alternator then drops, the cycle will repeat, in rapid sequence.

This cycle will continue provided there is no trouble with the alternator. If one of the alternator bearings should over-heat, the resistance value of resistor 1 will increase. Consequently, the voltage at junction J drops in the direction of the level of chassis or ground, so that the normally blocked transistor 7 is changed over to its conductive state. This established a ground connection through the closed switch 11 and charge control lamp 12 which will light brightly, having full alternator output or battery voltage applied thereacross. The lamp will remain lit as long as resistor 1 remains hot. Diode 13 is provided to prevent grounding of the D+ terminal through the then conductive transistor 7.

Lighting of the charge control lamp 12 is a signal to the operator that there is damage in the alternator, and for example that the bearings are over-heating. The warning system thus provides an indication to the operator to seek repair assistance as soon as possible, and before the damage becomes so extensive that the alternator will be severely damaged or destroyed. It is hardly possible to make a mistake with respect to the indication received from charge control lamp 12. The charge control lamp 12 will light only when the alternator operates at very low speeds, that is, when the voltage of battery 10 is in excess of the voltage appearing at terminal B+ and the field is connected; such illumination of the charge control lamp 12 ordinarily is only at very low level and occurs only upon starting or under unusual vehicular operating conditions. Bright lighting of lamp 12 under normal engine operation thus is an indication of generator trouble.

Various changes and modifications may be made, specifically with respect to the circuitry of the voltage regulator, and the alternator and its rectifier system.

I claim:

1. In an automotive on-board network electrical system with malfunction warning indicating having
   a generator (2) having a field winding (14) and a field excitation terminal (D+) connected to the field winding;
   a battery (10);
   a voltage regulator (VR) connected to the generator and sensing the output voltage of the generator, and further connected to the field excitation terminal (D+) to control current flow through the field winding (14);
   A charge control lamp (12) having terminals connected to the output of the generator and to the battery respectively;
   and means (W) to indicate bearing trouble in the alternator and controlling said charge control lamp to provide a trouble indication including
   a temperature sensitive resistor (1) located in heat transfer relation to at least one of the bearings of the generator;
   and an evaluation network (3, 4, 6, 7) connected to said temperature sensitive resistor (1) and additionally to the charge control lamp (12) to cause the lamp to provide a trouble indication by lighting if the temperature of the respective bearing, and the resistance of the temperature sensitive resistor (1), changes beyond a predetermined limit, the evaluation network including a voltage divider (3, 1, 4) of which the temperature sensitive resistor (1) is a part, a switching transistor (7) connected to a junction or tap point of the voltage divider;
   the switching transistor (7) being connected to a terminal of the charge control lamp to, selectively, control illumination thereof upon rise in temperature of a bearing of the generator (2) and said charge control lamp further providing an indication if the output voltage of the generator is below the voltage of the battery;
   and a blocking diode (13) connected between the junction of the connection of the main current carrying path of the switching transistor (7) with a terminal of the charge control lamp (12), and the field excitation terminal (D+).

2. System according to claim 1, wherein the main current carrying path of the switching transistor (7) is serially connected between the charge control lamp (12) and ground or chassis of the network.

3. System according to claim 1, wherein the generator (2) is a slip ring-less alternator.

4. In an automotive on-board network electrical system with malfunction warning indication having
   a generator (2) having a field winding (14) and a field excitation terminal (D+) connected to the field winding;
   a battery (10);
   a voltage regulator (VR) connected to the generator and sensing the output voltage of the generator, and further connected to the field excitation terminal (D+) to control current flow through the field winding (14);
   a charge control lamp (12) connected to the output of the generator and to the battery and providing an indication if the output voltage of the generator is below the voltage of the battery;
   and means (W) to indicate bearing trouble in the alternator and controlling said charge control lamp to provide a trouble indication including
   a temperature sensitive resistor (1) located in heat transfer relation to at least one of the bearings of the generator;
   an evaluation network including a switching semiconductor (7) having its conduction state controlled as a function of the resistance of the temperature sensitive resistor (1), the switching semiconductor having its main current carrying path connected to a first terminal of the charge control lamp

(12) and to one terminal of the battery (10), the other terminal (B+) of the battery being connected to another terminal of the charge control lamp whereby, when the switching semiconductor is rendered conductive upon rise in temperature of a bearing of the alternator, a direct current path will be established from the other terminal of the battery through the charge control lamp and through the main current carrying path of the switching semiconductor to the said one terminal of the battery to provide a warning indication;

and a blocking diode (13) connected between the junction of the connection of the main current carrying path of the switching transistor (7) with the first terminal of the charge control lamp (12), and the field excitation terminal (D+).

5. System according to claim 3, wherein the generator (2) is a slip ring-less alternator.

* * * * *